(12) United States Patent
Cho et al.

(10) Patent No.: US 7,580,278 B2
(45) Date of Patent: *Aug. 25, 2009

(54) VARIABLE RESISTANCE MEMORY DEVICE

(75) Inventors: Beak-Hyung Cho, Hwseong-si (KR);
Jong-Soo Seo, Hwseong-si (KR);
Won-Seok Lee, Suwon-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 5 days.

This patent is subject to a terminal disclaimer.

(21) Appl. No.: 11/868,992

(22) Filed: Oct. 9, 2007

(65) Prior Publication Data

US 2008/0025081 A1    Jan. 31, 2008

Related U.S. Application Data

(63) Continuation-in-part of application No. 11/319,284, filed on Dec. 29, 2005, now Pat. No. 7,295,464.

(30) Foreign Application Priority Data

Dec. 9, 2005    (KR) .............................. 2005-120602

(51) Int. Cl.
*G11C 11/00* (2006.01)
(52) U.S. Cl. ........................ 365/163; 365/113; 365/148
(58) Field of Classification Search .................. 365/113
See application file for complete search history.

(56) References Cited

U.S. PATENT DOCUMENTS

| | | | | |
|---|---|---|---|---|
| 5,453,959 A * | 9/1995 | Sakuta et al. .......... 365/189.09 |
| 5,546,355 A | 8/1996 | Raatz et al. |
| 6,260,104 B1 * | 7/2001 | Roohparvar ................. 711/103 |
| 6,487,113 B1 | 11/2002 | Park et al. |
| 6,707,759 B2 * | 3/2004 | Song ..................... 365/189.15 |
| 7,012,834 B2 * | 3/2006 | Cho et al. .................... 365/163 |
| 7,149,103 B2 * | 12/2006 | Ahn ........................... 365/148 |
| 7,206,237 B2 * | 4/2007 | Kim ........................... 365/201 |
| 7,262,990 B2 * | 8/2007 | Cho et al. .................... 365/163 |
| 7,295,464 B2 * | 11/2007 | Cho et al. .................... 365/163 |
| 2005/0068804 A1 | 3/2005 | Choi et al. |
| 2006/0087876 A1 | 4/2006 | Cho et al. |
| 2006/0221679 A1 | 10/2006 | Kang et al. |
| 2008/0062753 A1 * | 3/2008 | Cho et al. .................... 365/163 |

FOREIGN PATENT DOCUMENTS

| | | |
|---|---|---|
| JP | 2003-331574 | 11/2003 |
| KR | 1020050017352 A | 2/2005 |
| KR | 10200500898500 | 9/2005 |
| WO | 2004/024659 A1 | 3/2004 |
| WO | WO2004/025659 A1 | 3/2004 |

* cited by examiner

*Primary Examiner*—Tan T. Nguyen
(74) *Attorney, Agent, or Firm*—Volentine & Whitt, PLLC

(57) ABSTRACT

A variable resistance memory device includes a memory cell array having a plurality of memory cells, a write driver which supplies a step-down set current to the memory cells, where the step-down set current includes a plurality of successive steps of decreasing current magnitude, and a set program control circuit which controls a duration of the step-down set current supplied by the write driver. The set program control circuit controls the duration of the step-down set current in accordance with at least one of data contained in an mode register set (MRS) and a conductive state of a fuse element.

10 Claims, 11 Drawing Sheets

VARIABLE RESISTANCE MEMORY DEVICE

CROSS-REFERENCE TO RELATED APPLICATIONS

This is a continuation-in-part of application Ser. No. 11/319,284, filed Dec. 29, 2005, now U.S. Pat. No. 7,295,464 which is incorporated herein by references in its entirety.

BACKGROUND

The present invention relates to semiconductor memory devices and, more particularly, to memory devices which include variable resistance memory cells which stored data according to a programmed resistance thereof.

A claim of priority under 35 U.S.C. § 119 is made to Korean Patent Application 2005-120602 filed on Dec. 9, 2005, the entire contents of which are hereby incorporated by reference.

Generally, semiconductor memory devices are categorized as random access memories (RAMs) or read-only memories (ROMs). ROMs are non-volatile memory devices such as PROMs (programmable ROMs), EPROMs (erasable PROMs), EEPROMs (electrically EPROMs), and flash memory devices, which retain their stored data even when their power supplies are interrupted. Meanwhile, RAMs are traditionally volatile memory devices such as dynamic RAMs (DRAMs) and static RAMs (SRAMs), which lose their stored data when their power supplies are interrupted.

However, new types of RAMs containing nonvolatile memory devices have recently been introduced or proposed. Examples includes ferroelectric RAMs (FRAMs) employing ferroelectric capacitors, magnetic RAMs (MRAMs) employing tunneling magneto-resistive (TMR) films, and phase change memories (PRAMs) using chalcogenide alloys. Among these, the variable resistance memory devices are relatively easy to fabricate, and thus variable resistance memory devices may provide the best opportunities in the actual implementation of high-capacity, low cost nonvolatile RAMs.

FIG. 1 illustrates an example of a memory cell 10 of a variable resistance memory device. As shown, the memory cell 10 includes a memory element 11 and a select element 12 connected between a bitline BL and a ground voltage. In this example, the select element 12 is an NMOS transistor NT having a gate connected to a wordline WL.

The memory element 11 includes a phase change material such as germanium-antimony-tellurium (Ge—Sb—Te, also referred to as "GST"), which functions as a variable resistor (i.e., resistance being variable with heat). The phase change material is conditioned in one of two stable states, i.e., a crystalline state or an amorphous state. The phase change material changes into the crystalline state or the amorphous state, based on current supplied through the bitline BL. The phase change memory programs data therein by means of such a characteristic of the phase change material.

When a predetermined voltage is applied to the wordline WL, the NMOS transistor NT is turned on to enable the memory element 11 to receive the current supplied through the bitline BL.

In FIG. 1, the memory element 11 is coupled between the bitline BL and the select element 12. However, the select element 12 may instead be coupled between the bitline BL and the memory element 11.

FIG. 2 illustrates another example of a memory cell 20 of a variable resistance memory device. The memory cell 20 includes a memory element 21 and a select element 22 connected between a bitline BL and a wordline WL. The select element 22 of this example includes a diode D having an anode to which the memory element 21 is connected and a cathode to which the wordline WL is connected. When a voltage differential between the anode and the cathode of the diode D becomes higher than a threshold voltage of the diode D, the diode D is turned on to enable the memory element 21 to receive the current supplied through the bitline BL.

In FIG. 2, the memory element 21 is coupled between the bitline BL and the select element 22. However, the select element 22 may instead be coupled between the bitline BL and the memory element 21.

FIG. 3 is a graph showing temperature characteristics during programming of the phase change material (GST) illustrated in FIG. 1 and FIG. 2. In FIG. 3, a reference number 1 denotes the GST temperature characteristic during programming to the amorphous state, while a reference number 2 denotes the GST temperature characteristic during programming to the crystalline state.

As illustrated in FIG. 3, the phase change material (GST) turns to the amorphous state when it is rapidly quenched after being heated over its melting point Tm by supplied current during a time T1. The amorphous state is usually referred to as a reset state, storing data '1'. On the other hand, the phase change material is settled in the crystalline state when it is slowly quenched after being heated within a temperature window that higher than a crystallization temperature Tc and low than the melting point Tm during a time T2 which is longer than T1. The crystalline state is usually referred to as a set state, storing data '0'. The resistance in the memory cell is relatively high in the amorphous state, and relatively low in the crystalline state.

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

The phase change memory cell is programmed in the reset state or set state in accordance with the magnitude and duration of a programming current applied to the cell. Generally, the phase change memory is configured to supply a predefined "reset current" for programming the memory cell in the reset state, and a predefined "set current" for programming the memory cell in the set state.

In order to properly change the phase change material into the crystalline state, the set current of a given magnitude and duration must be applied to the cell to achieve the GST temperature characteristic illustrated in previously described FIG. 3. It turns out, however, that it difficult in actual applications to achieve temperature characteristics which will reliably set the GST material in its crystalline state. More precisely, it is difficult to achieve a suitably narrow resistance distribution when setting the GST material in its crystalline state.

In order to narrow the resistance distribution of phase change memory cells programmed into the set state, it has been proposed to adopt a "step-down current scheme." According to this technique, the magnitude of the set current is decreased in steps during programming of each memory cell into the crystalline state.

While the step-down current scheme is effective in narrowing the resistance distribution of phase change memory cells in the crystalline state, it does not overcome another practical problem associated with the programming of phase change memory cells. That is, due to process variations encountered during fabrication of phase change memory chips, the ideal duration of the set current can vary from chip to chip. As such, it is necessary to adopt a worst-case set current duration, which has the effect of reducing the overall programming speed of the fabricated memory chips.

SUMMARY OF THE INVENTION

In an exemplary embodiment, a variable resistance memory device is provided which includes a memory cell array having a plurality of memory cells, a write driver which supplies a step-down set current to the memory cells, where the step-down set current includes a plurality of successive steps of decreasing current magnitude, and a set program control circuit which controls a duration of the step-down set current supplied by the write driver. The set program control circuit controls the duration of the step-down set current in accordance with at least one of data contained in an mode register set (MRS) and a conductive state of a fuse element.

In another exemplary embodiment, a variable resistance memory device is provided which includes a memory cell array having a plurality of memory cells, a write driver which supplies a step-down set current to the memory cells, where the step-down set current includes a plurality of successive steps of decreasing current magnitude, and a set program control circuit which controls a duration of the step-down set current supplied by the write driver. The set program control circuit controls the number of steps of the step-down set current to control the duration of the step-down set current, and the set program control circuit controls the number of steps of the step-down set current in accordance with at least one of data contained in an mode register set (MRS) and a conductive state of a fuse element.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF PREFERRED EMBODIMENTS

Preferred embodiments of the present invention will be now described hereinafter more fully with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 4:
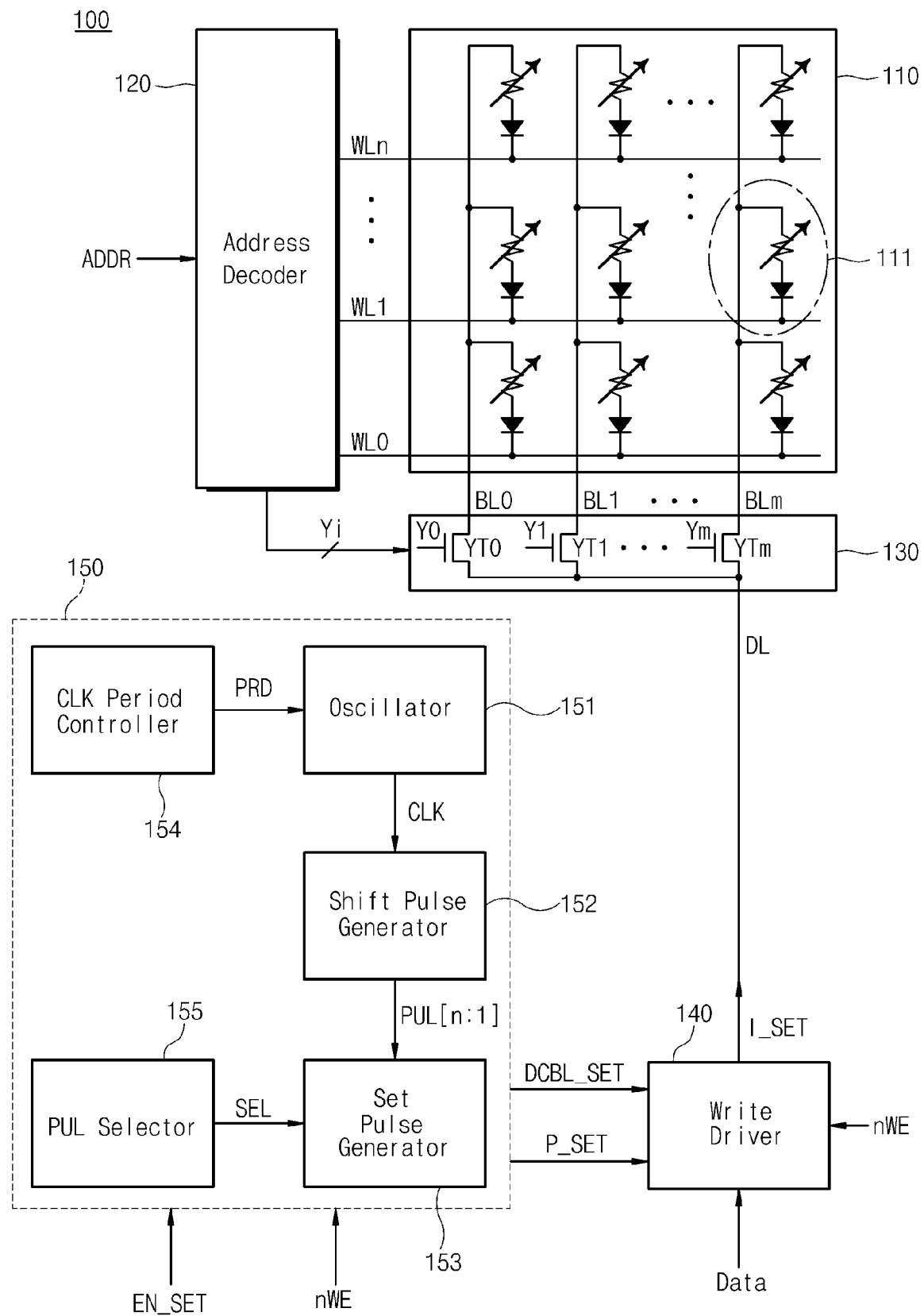
FIG. 4 is a block diagram of a variable resistance memory device according to an embodiment of the present invention.

FIG. 4 is a block diagram of a variable resistance memory device 100 according to an embodiment of the present invention. The variable resistance memory device 100 of this embodiment includes a memory cell array 110, an address decoder 120, a bitline select circuit 130, a write driver 140, and a set program control circuit 150.

The memory cell array 110 includes a plurality of variable resistance memory cells 111 connected to a plurality of wordlines WL0-WLn and a plurality of bitlines BL0-BLm. The variable resistance memory cells which store data based on a programmed resistance thereof. For example, a high resistive state may be indicative of one of data "1" or "0", and a low resistive state may be indicative of the other of data "1" or "0". Also, multi-bit cells may be realized by programming the variable resistive cells to any one of four or more resistive states. In this example, each of the memory cells contains a memory element including a phase change material and a select element.

Figure 1:
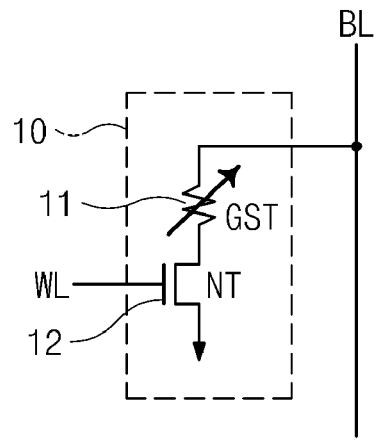
FIG. 1 is a circuit diagram of an example of a memory cell of a variable resistance memory device.
Figure 2:
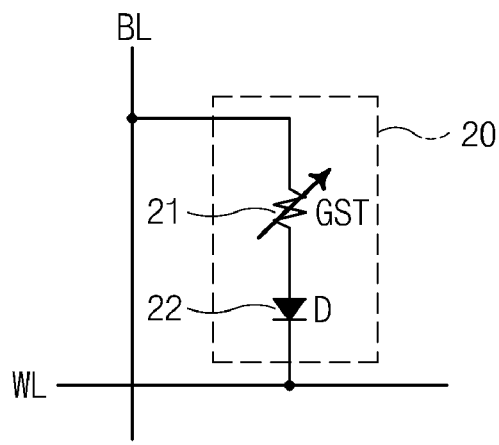
FIG. 2 is a circuit diagram of another example of a memory cell of a variable resistance memory device.
Figure 3:
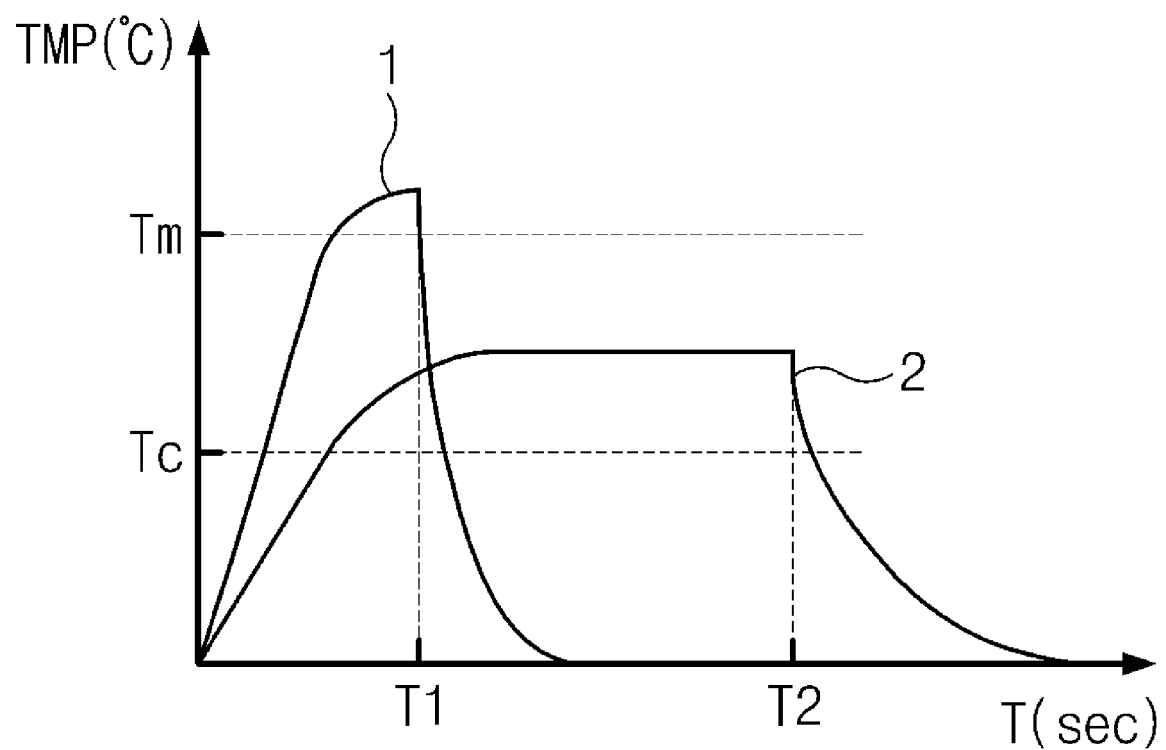
FIG. 3 is a graph showing temperature characteristics during programming of a phase change material.

In the example of FIG. 4, each memory cell 111 is configured as in previously described FIG. 2. That is, in FIG. 4, each memory cell 111 includes a phase change memory element and a diode connected in series between a corresponding bitline BL and a corresponding wordline WL. However, the invention is not limited to the memory cell configuration of FIG. 4. For example, each memory cell 111 may instead be configured as in previously described FIG. 1. In this case, each memory cell would include a memory element and a transistor connected between a corresponding bitline BL and a reference potential (e.g., ground), and a gate of the transistor would be connected to a wordline WL.

The address decoder 120 decodes an externally input address ADDR and selects a wordline and a bitline. That is, the address ADDR includes row address RA data for selecting among the wordlines WL0-WLn and column address CA data for selecting among the bitlines BL0-BLm. In the explanation that follows hereinafter, it is assumed that the wordline WL1 is selected among the wordlines WL0-WLn and the bitline BLm is selected among the bitlines BL0-BLm. In this manner, the memory cell 111 encircled by the dashed line of FIG. 4 is selected.

The bitline select circuit 130 selects a bitline in response to a select signal Yi (i=0–m) from the address decoder 120. The bitline select circuit 130 includes a plurality of NMOS transistors YT0-YTm, which connect the bitlines BL0-BLm with a data line DL. When, for example, a select signal Ym is enabled, the bitline BLm and the data line DL are electrically connected with each other.

The write driver 140 supplies a program current to a selected memory cell 111 and operates in response to a write enable signal nWE. That is, the write driver 140 supplies either a step-down set current I_SET or a reset current I_RESET (not shown in FIG. 4) to the memory cell 111 depending on the logic value of input data (Data).

When supplying the step-down set current I_SET to the memory cell 111, the write driver 140 operates under control of a set voltage DCBL_SET and a set pulse P_SET which are generated by the set program control circuit 150. As shown in FIG. 4, the set program control circuit 150 operates in response to the write enable signal new and a set enable signal EN_SET, and includes a clock (CLK) period controller 154, an oscillator 151, a shift pulse generator 152, a pulse (PUL) selector 155, and a set pulse generator 153.

The oscillator 151 is responsive to the set enable signal EN_SET to generate a clock signal CLK having a period corresponding to a period setting signal received from the clock period controller 154.

The shift pulse generator 152 generates a plurality of shift pulses PUL[n:1] in synchronization with the transition of the clock signal CLK.

The set pulse generator 153 generates the set voltage DCBL_SET and the set pulse P_SET in response to the shift pulses PUL[n:1]. The set voltage DCBL_SET is applied to control the magnitude of the step-down set current I_SET, and the set pulse P_SET is used to control the set program duration of the step-down set current I_SET.

As described above, the set program control circuit 150 includes the clock period controller 154 which supplies the period set signal PRD to the oscillator 151, thereby controlling the period of the clock signal CLK. By controlling the period of the clock signal CLK, the variable resistance memory device 100 may control a unit step time of the step-down current I_SET. In other words, if the period of the clock signal CLK is shortened, the unit step time and the set program time of the step-down set current I_SET are shortened as well.

Optionally, the clock period controller 154 may be physically embodied by one or more fuses which are selectively opened (or closed) to generate the period set signal PRD. Alternatively, the clock period controller 154 may be implemented using a mode register set (MRS) of the memory device. In the case, the period set signal PRD is established based on data pre-stored in the MRS.

As described above, the set program time of the step-down set current I_SET is variable with change in period of the clock signal CLK, which will be described in detail later with reference to FIG. 6 and FIG. 7.

The pulse selector 155 supplies a select signal SEL to the set pulse generator 153, thereby controlling a pulse width of the set pulse P_SET. That is, the select signal SEL is used for selecting among the plurality of shift pulses PUL[n:1]. The pulse width of the set pulse P_SET is regulated based on the number of selected shift pulses. By regulating the pulse width of the set pulse P_SET, the variable resistance memory device 100 may control the number of steps of the step-down set current I_SET.

If, for example, two beginning shift pulses PUL[2:1] are unselected among the shift pulses PUL[n:1], the two beginning steps of the step-down set current I_SET will decrease in number. This will be described in detail later with reference to FIG. 8.

If the last shift pulse PUL[n] is unselected, the last step of the step-down set current I_SET will decrease in number. This will be described in detail later with reference to FIG. 9.

If the two beginning pulses PUL[2:1] and the last shift pulse PUL[n] are unselected, the two beginning steps and the last step of the step-down set current I_SET will decrease in number. This will be described in detail later with reference to FIG. 10.

If the steps of the step-down set current I_SET decrease in number, the set program time thereof is shortened. Optionally, the pulse selector 155 may be physically embodied by one or more fuses.

As described above, the unit step time of the step-down set current I_SET may be shortened or the steps thereof may be decreased in number to shorten set program time thereof. As such, the set programming speed may be enhanced.

Figure 5:
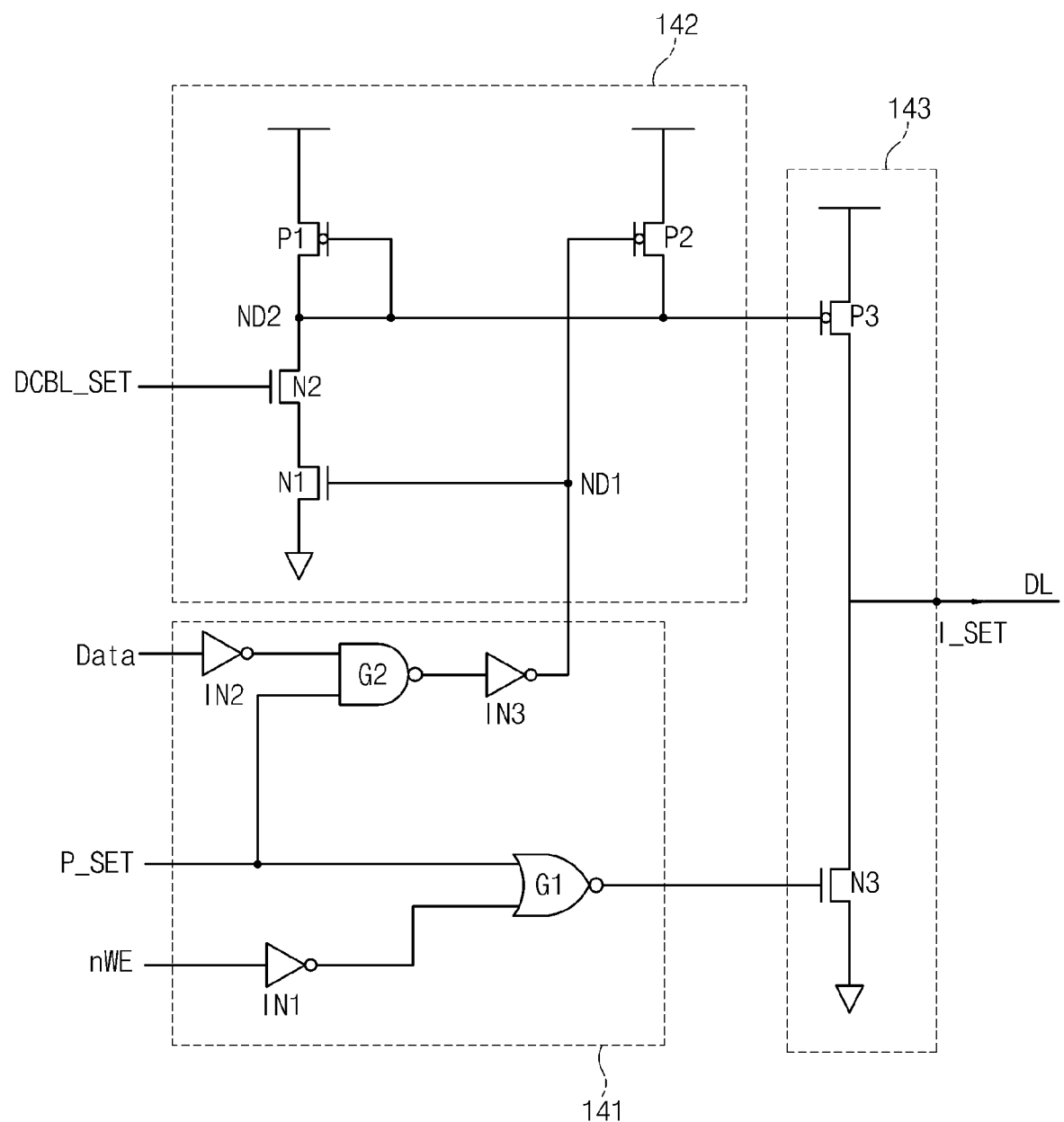
FIG. 5 is a circuit diagram of a write driver illustrated in FIG. 4 according to an embodiment of the present invention.

FIG. 5 is a circuit diagram of the write driver 140 illustrated in FIG. 4 according to an embodiment of the present invention. As shown, the write driver 140 includes a set pulse input circuit 141, a set current control circuit 142, and a set current driver circuit 143.

The set pulse input circuit 141 includes three inverters IN1-IN3, a NOR gate G1, and a NAND gate G2. The set current control circuit 142 includes two NMOS transistors N1 and N2 and two PMOS transistors P1 and P2. The set current driver circuit 143 includes an NMOS transistor N3 and a PMOS transistor P3.

When a write enable signal nWE has a low level L, the NMOS transistor N3 is turned off. At this time, the write driver 140 provides a step-down set pulse I_SET to a data line DL according to Data and a set pulse P_SET. If a set pulse P_SET of a high level 'H' is applied when the data is '0', a first node ND1 becomes high. When the first node ND1 has a high level, the NMOS transistor N1 is turned on while the PMOS transistor is turned off. A voltage level of a second node ND2 is variable with the magnitude of a set voltage DCBL_SET. Further, the magnitude of current flowing through the PMOS transistor P3 is variable with the voltage level of the second node ND2.

The set program time of the step-down set current I_SET is variable with the pulse width of the set pulse P_SET. Further, the magnitude of the step-down set current I_SET is variable with the magnitude of the set voltage DCBL_SET. Namely, the write driver 140 establishes the set program time and magnitude of the step-down set current I_SET according to the set pulse P_SET and the set voltage DCBL_SET.

Figure 6:
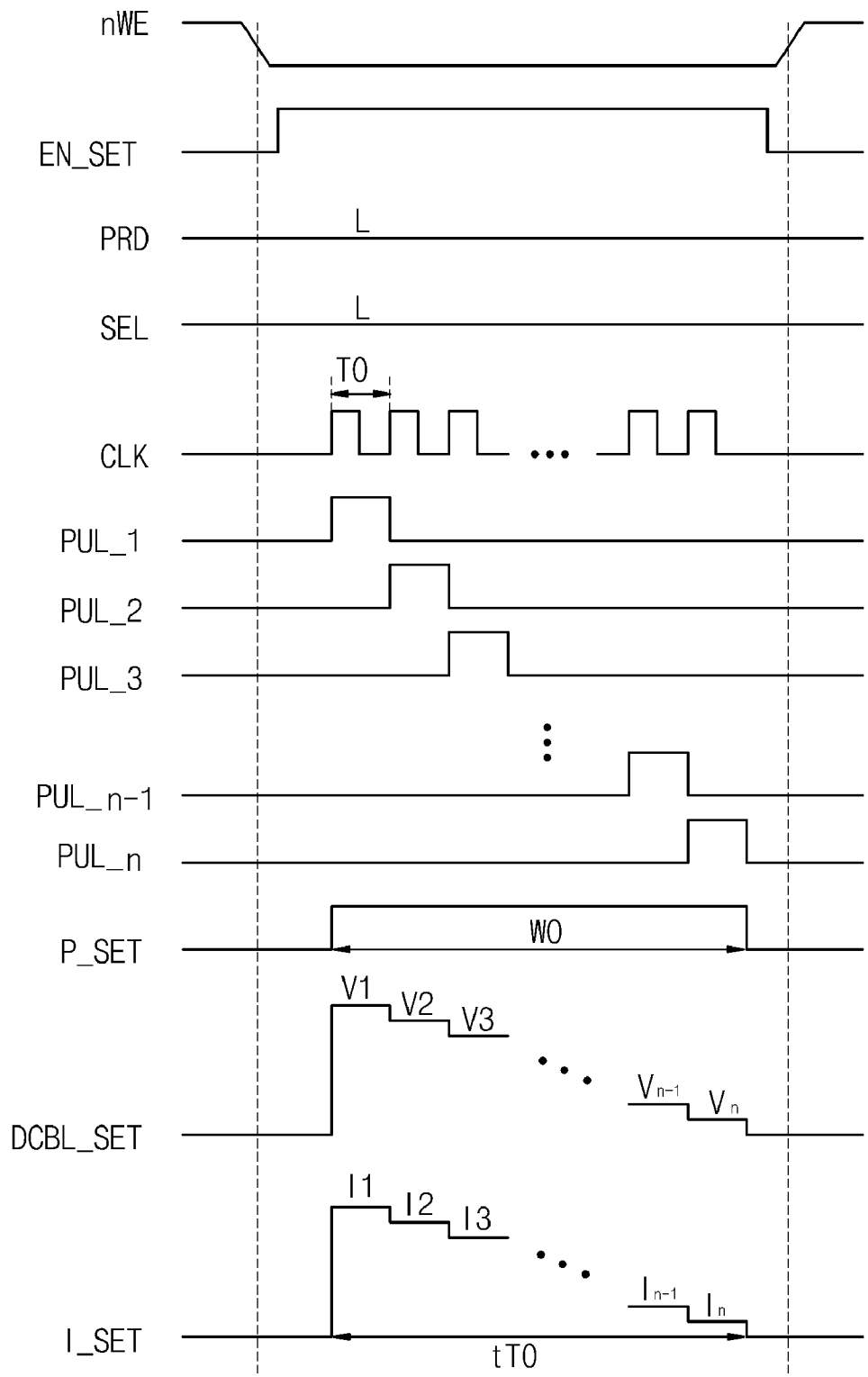
FIG. 6 through FIG. 10 are timing diagrams for use in explaining the operation of a set program control circuit illustrated in FIG. 4 according to an embodiment of the present invention.
Figure 7:
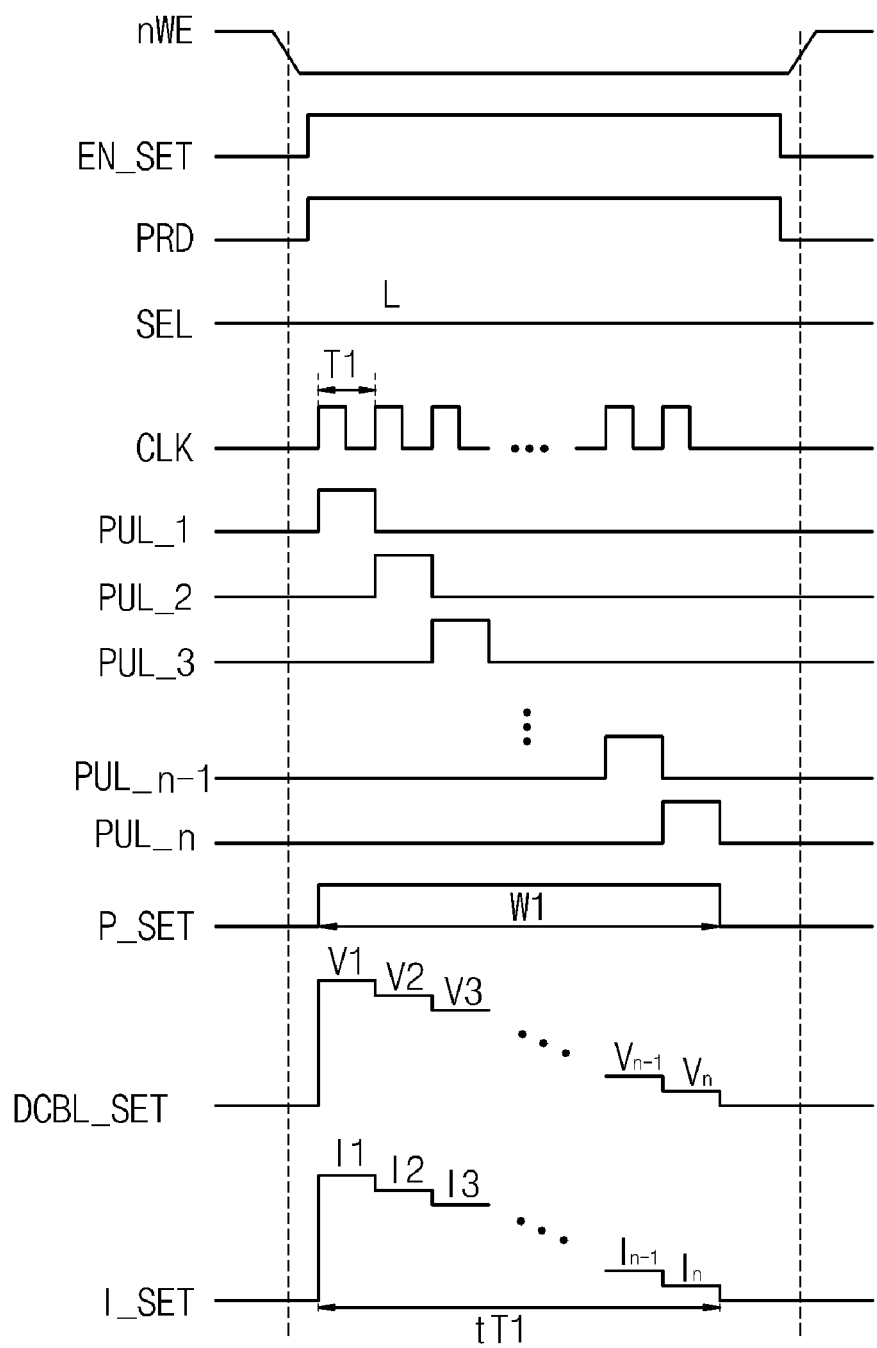
Figure 8:
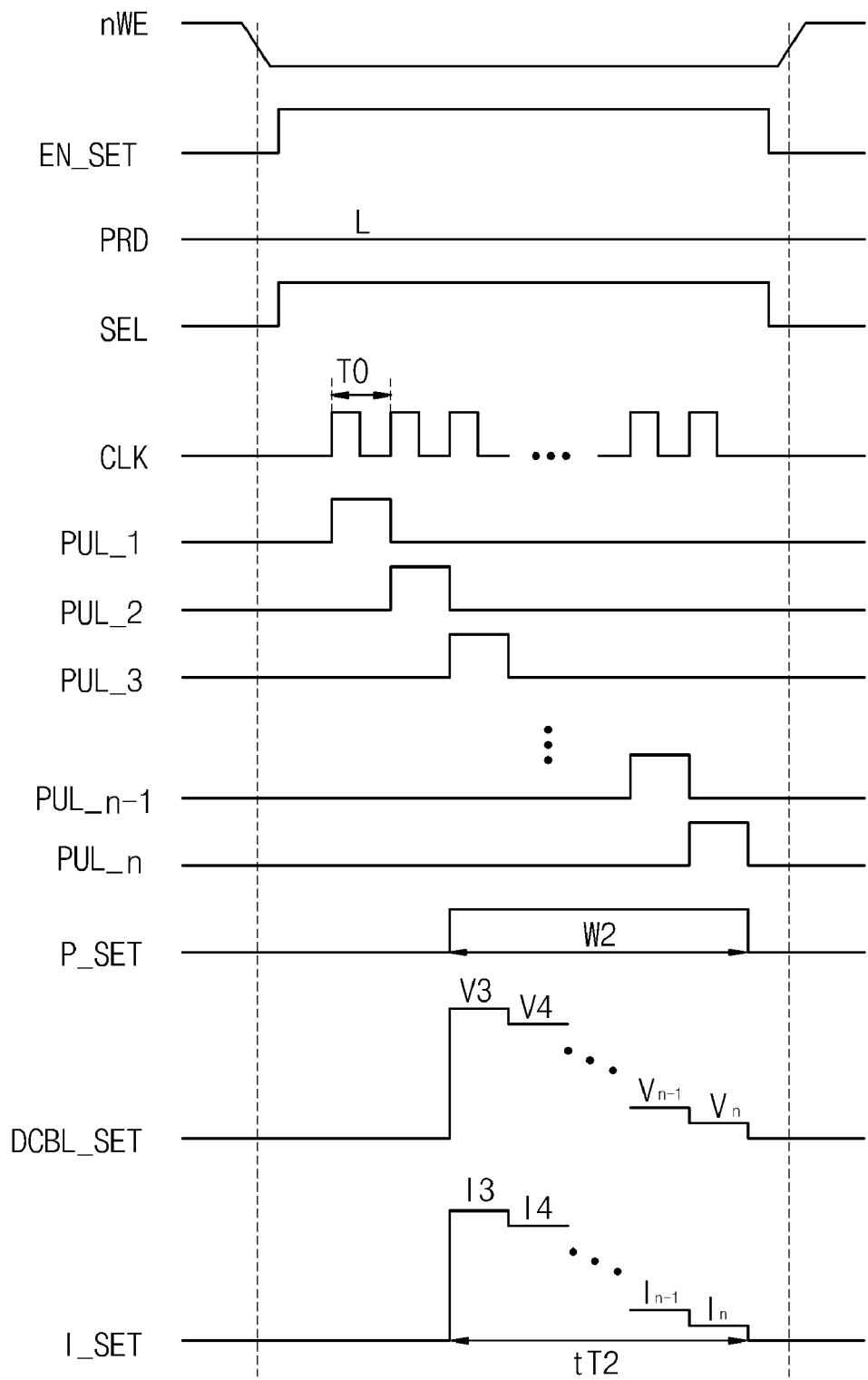
Figure 9:
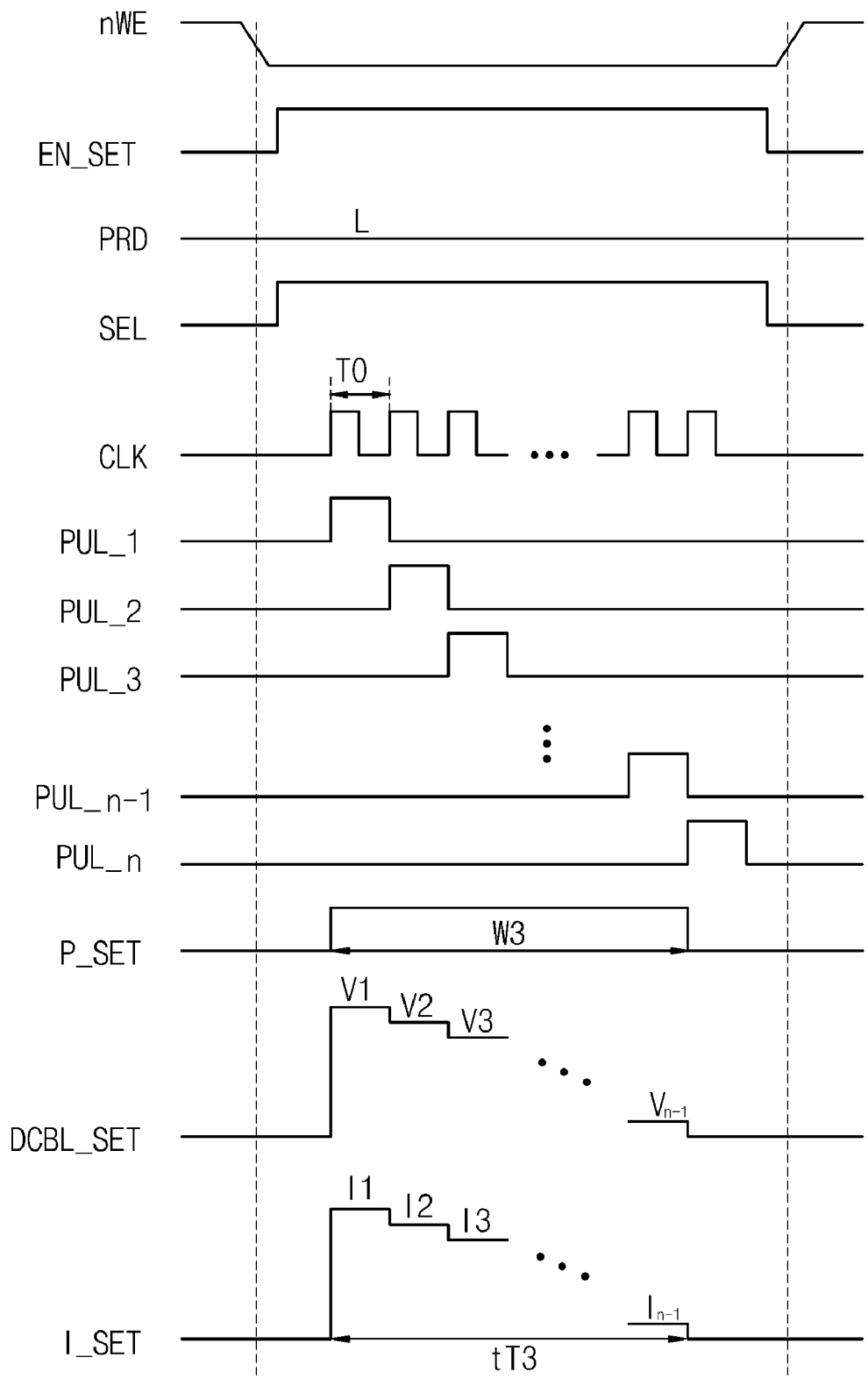
Figure 10:
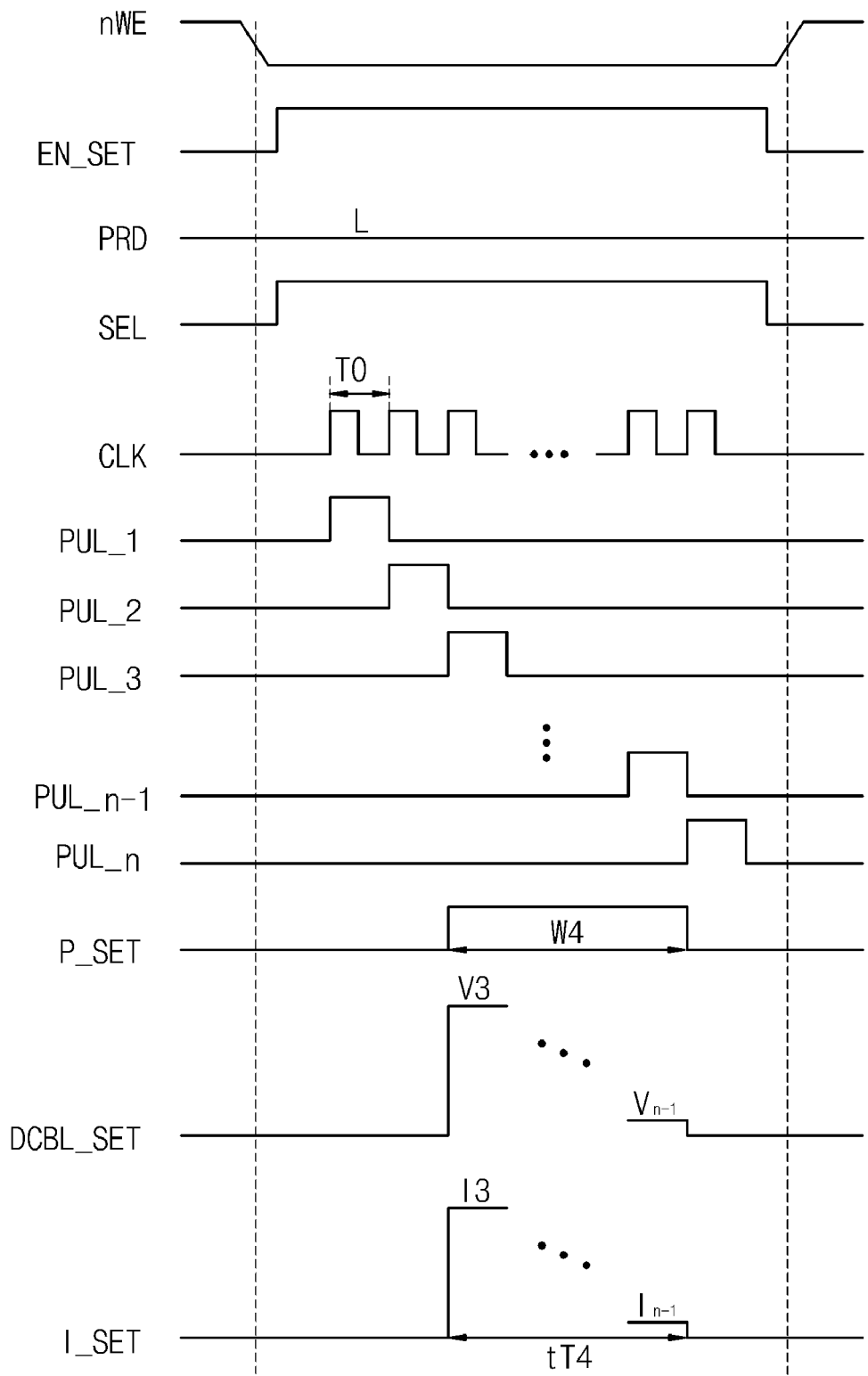

FIG. 6 through FIG. 10 are timing diagrams for explaining an operation of the set program control circuit 150 illustrated in FIG. 4. More specifically, FIG. 6 shows a case where a period set signal PRD and a select signal SEL are disabled, and FIG. 7 shows a case where the period set signal PRD is selected. FIG. 8 through FIG. 10 show examples where the select signal SEL is enabled.

Referring to FIGS. 4 and 6, step-down set current I_SET has a unit step time T0 and a set program time tT0. If a set enable signal EN_SET is applied, the oscillator 151 generates a clock signal CLK having a period T0. The shift pulse generator 152 generates a plurality of shift pulses PUL_1-PUL_n step-by-step in synchronization with a low-to-high transition of the clock signal CLK. The set pulse generator 153 receives the shift pulses PUL_1-PUL_n, generating a set pulse P_SET and a set voltage DCBL_SET.

The set pulse P_SET is enabled in response to a first shift pulse PUL_1 and disabled in response to an nth shift pulse PUL_n. At this time, the set pulse P_SET has a pulse width W0. The set voltage DCB_L_SET is a step voltage dropping from V1 to Vn step-by-step and is generated from a voltage divider (not shown) constructed in the set pulse generator 153. The voltage divider includes a plurality of resistors connected in series and a plurality of selectors connected to both ends of the respective resistors. As the selectors are turned on or off step-by-step, the voltage divider generates a step voltage.

If the set pulse P_SET and the set voltage DCBL_SET are applied to the write driver 140, the write driver 140 generates a step-down set current dropping step-by-step from I1 to In. The step-down set current has a unit step time T0, n steps, and a set program time tT0.

As mentioned above, FIG. 7 is a timing diagram for explaining the operation of a set program control circuit 150 in a case where the clock period controller 154 illustrated in FIG. 4 provides a period decision signal PRD. Referring to FIGS. 4 and 7, if the period decision signal PRD is applied to the oscillator 151, the oscillator 151 generates a clock signal CLK having a period T1. The period T1 is shorter than T0 (see FIG. 6).

If the period of the clock signal CLK is shortened, the pulse width of the shift pulses PUL_1-PUL_n is also shortened. If the pulse width of the shift pulses PUL_1-PUL_n is shortened, a pulse width W1 of the set pulse P_STE and the unit step time of the set voltage DCBL_SET are shortened. If the unit step time of the set voltage DCBL_SET is shortened, the unit step time of the step-down set current I_SET is also shortened. Since the pulse width W1 of the set pulse P_SET is shortened, a set program time tT1 is also shortened. As illustrated in FIG. 7, the variable resistance memory device 100 according to the present embodiment makes it possible to shorten a set program time and thus enhance a program speed.

As mentioned above, FIG. 8 through FIG. 10 are timing diagrams for explaining the operation of the set program control circuit 150 in different examples where the pulse selector 155 illustrated in FIG. 4 provides a select signal SEL. If the select signal SEL is applied to a set pulse generator 153, the set pulse generator 153 partially selects a plurality of shift pulses PUL_1-PUL_n according to the select signal SEL. The set pulse generator 153 generates a set pulse P_SET and a set voltage DCBL_SET through the selected shift pulse.

FIG. 8 illustrates the example where the set pulse generator 153 selects the third to nth shift pulses PUL_3-PUL_n in response to the select signal SEL. The set pulse P_SET is enabled in response to the third shift pulse PUL_3 and disabled in response to the nth shift pulse PUL_n. At this time, the set pulse P_SET has a pulse width W2. The pulse width W2 is shorter than the pulse width W0 (see FIG. 6). Since the first and second pulses PUL_1 and PUL_2 are unselected, the set voltage DCBL_SET does not generate first and second step voltages V1 and V2. The set voltage DCBL_SET is a step voltage dropping step-by-step from V3 to Vn. According to the set pulse P_SET and the set voltage DCBL_SET, the step-down set current I_SET drops step-by-step from I3 to In during a set program time tT2.

FIG. 9 illustrates the example where the set pulse generator 153 selects first to (n−1)th shift pulses PUL_1-PUL_n−1 in response to the select signal SEL. The set pulse P_SET is enabled in response to the first shift pulse PUL_1 and disabled in response to the (n−1)th pulse PUL_n−1. At this time, the set pulse P_SET has a pulse width W3. The pulse width W3 is shorter than the pulse width W0 (see FIG. 6). Since the nth shift pulse PUL_n is unselected, the set voltage DCBL_SET does not generate an nth step voltage. The set voltage DCBL_SET is a step voltage dropping step-by-step from V1 to Vn−1. According to the set pulse P_SET and the set voltage DCBL_SET illustrated in FIG. 9, step-down set current I_SET drops step-by-step from I1 to In−1 during a set program time tT3.

FIG. 10 illustrates an example where the pulse generator 153 selects third to (n−1)th shift pulses PUL_3-PUL_n−1 in response to the select signal SEL. The set pulse P_SET is enabled in response to the third shift pulse PUL_3 and disabled in response to the (n−1)th shift pulse PUL_n−1. At this time, the set pulse P_SET has a pulse width W4. The pulse width W4 is shorter than the pulse width W0 (see FIG. 6). Since the first shift pulse PUL_1, the second shift pulses PUL_2, and the nth shift pulse PUL_n are unselected, the set voltage DCBL_SET does not generate first, second, and nth step voltages V1, V2, and Vn. The set voltage DCBL_SET is a step voltage dropping step-by-step from V3 to Vn−1. According to the set pulse P_SET and the set voltage DCBL_SET illustrated in FIG. 10, step-down set current I_SET drops step-by-step from I3 to In−1 during a set program time tT4.

Referring to FIG. 8 through FIG. 10, if the select signal SEL is applied to the set pulse generator 153, the set pulse generator 153 partially selects among the plurality of shift pulses PUL_1-PUL_n according to the select signal SEL. The set pulse generator 153 may regulate a pulse width of the set pulse P_SET and the number of step voltages of the set voltage DCBL_SET according to a selected shift pulse. The number of steps of the step-down set current I_SET is regulated according to the number of the step voltages of the set voltage DCBL_SET, and the set program time is regulated according to the pulse width of the set pulse P_SET. As illustrated in these figures, the variable resistance memory device 100 according to the present embodiment makes possible to shorten a set program time and thus enhance a program speed.

Figure 11:
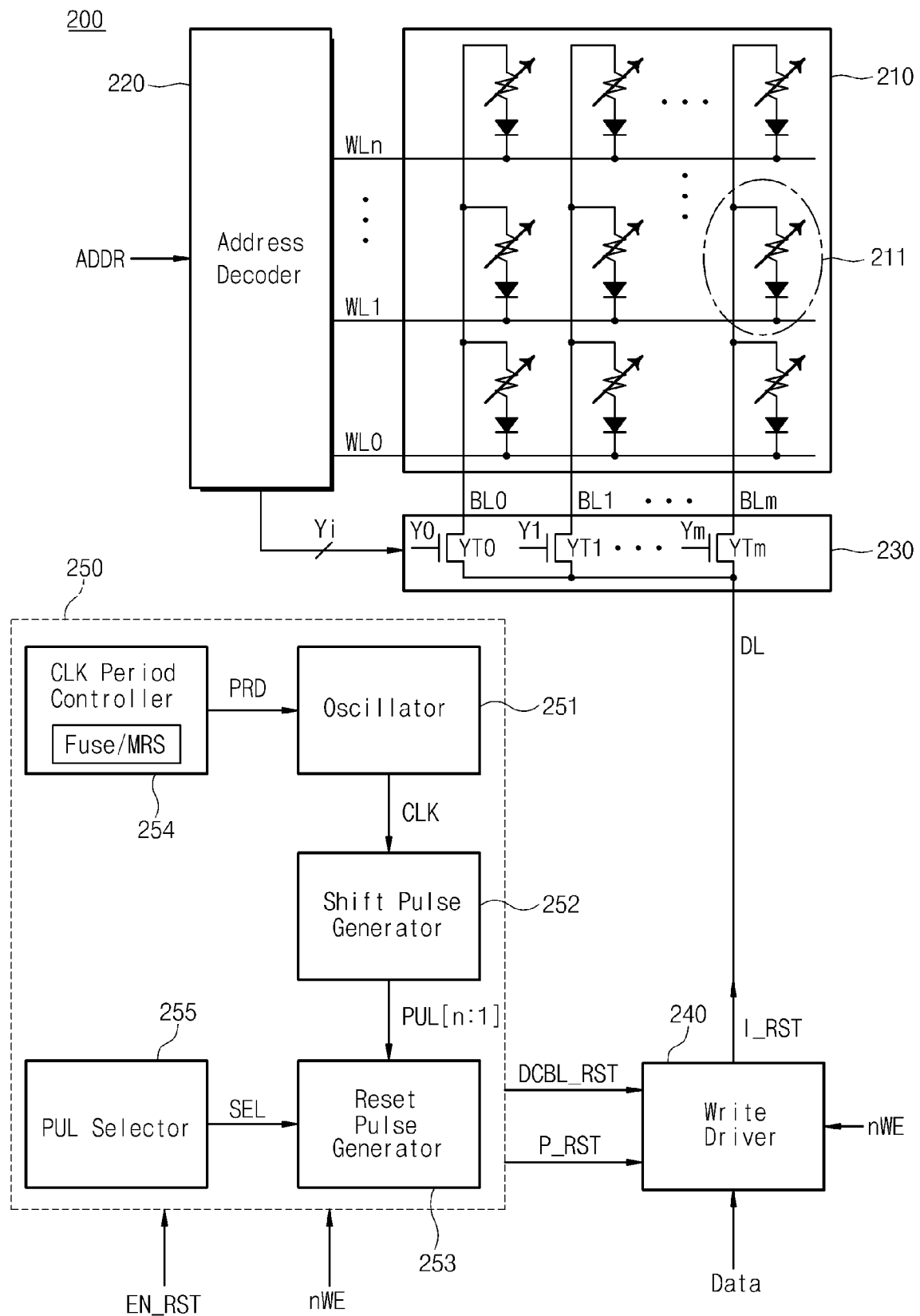
FIG. 11 is a is a block diagram of a variable resistance memory device according to an embodiment of the present invention.

FIG. 11 is a block diagram of a variable resistance memory device 200 according to another embodiment of the present invention. The variable resistance memory device 200 of this embodiment includes a memory cell array 210, an address decoder 220, a bitline select circuit 230, a write driver 240, and a reset program control circuit 250.

The memory cell array 210 includes a plurality of variable resistance memory cells 211 connected to a plurality of wordlines WL0-WLn and a plurality of bitlines BL0-BLm. The variable resistance memory cells which store data based on a programmed resistance thereof. For example, a high resistive state may be indicative of one of data "1" or "0", and a low resistive state may be indicative of the other of data "1" or "0". Also, multi-bit cells may be realized by programming the variable resistive cells to any one of four or more resistive states. In this example, each of the memory cells contains a memory element including a phase change material and a select element.

In the example of FIG. 11, each memory cell 211 is configured as in previously described FIG. 2. That is, in FIG. 11, each memory cell 211 includes a phase change memory element and a diode connected in series between a corresponding bitline BL and a corresponding wordline WL. However, the invention is not limited to the memory cell configuration of FIG. 11. For example, each memory cell 211 may instead be configured as in previously described FIG. 1. In this case, each memory cell would include a memory element and a transistor connected between a corresponding bitline BL and a reference potential (e.g., ground), and a gate of the transistor would be connected to a wordline WL.

The address decoder 220 decodes an externally input address ADDR and selects a wordline and a bitline. That is, the address ADDR includes row address RA data for selecting among the wordlines WL0-WLn and column address CA data for selecting among the bitlines BL0-BLm. In the explanation that follows hereinafter, it is assumed that the wordline WL1 is selected among the wordlines WL0-WLn and the bitline BLm is selected among the bitlines BL0-BLm. In this manner, the memory cell 211 encircled by the dashed line of FIG. 11 is selected.

The bitline select circuit 230 selects a bitline in response to a select signal Yi (i=0−m) from the address decoder 220. The bitline select circuit 230 includes a plurality of NMOS transistors YT0-Y™, which connect the bitlines BL0-BLm with a data line DL. When, for example, a select signal Ym is enabled, the bitline BLm and the data line DL are electrically connected with each other.

The write driver 240 supplies a program current to a selected memory cell 211 and operates in response to a write enable signal nWE. That is, the write driver 240 supplies either a step-down set current I_SET (not shown in FIG. 11) or a reset current I_RST to the memory cell 211 depending on the logic value of input data (Data).

When supplying the step-down set current I_RST to the memory cell 211, the write driver 240 operates under control of a reset voltage DCBL_RST and a reset pulse P_RST which are generated by the reset program control circuit 250. As shown in FIG. 11, the reset program control circuit 250 operates in response to the write enable signal nWE and a reset enable signal EN_RST, and includes a clock (CLK) period controller 254, an oscillator 251, a shift pulse generator 252, a pulse (PUL) selector 255, and a reset pulse generator 253.

The oscillator 251 is responsive to the reset enable signal EN_RST to generate a clock signal CLK having a period corresponding to a period setting signal received from the clock period controller 254.

The shift pulse generator 252 generates a plurality of shift pulses PUL[n:1] in synchronization with the transition of the clock signal CLK.

The reset pulse generator 253 generates the reset voltage DCBL_RST and the reset pulse P_RST in response to the shift pulses PUL[n:1]. The reset voltage DCBL_RST is applied to control the magnitude of the step-down reset current I_RST, and the reset pulse P_RST is used to control the reset program duration of the step-down reset current I_RST.

As described above, the reset program control circuit 250 includes the clock period controller 254 which supplies the period set signal PRD to the oscillator 251, thereby controlling the period of the clock signal CLK. By controlling the period of the clock signal CLK, the variable resistance memory device 200 may control a unit step time of the step-down current I_RST. In other words, if the period of the clock signal CLK is shortened, the unit step time and the set program time of the step-down reset current I_RST are shortened as well.

Optionally, the clock period controller 254 may be physically embodied by one or more fuses which are selectively opened (or closed) to generate the period set signal PRD. Alternately, the clock period controller 254 may be implemented using a mode register set (MRS) of the memory device. In the case, the period set signal PRD is established based on data pre-stored in the MRS.

As will be readily apparent to those skilled in the art, the operation of the embodiment of FIG. 11 is essentially the same as that of FIG. 4. Accordingly, a detailed description of the operative aspects of FIG. 11 is omitted here for brevity.

Figure 12:
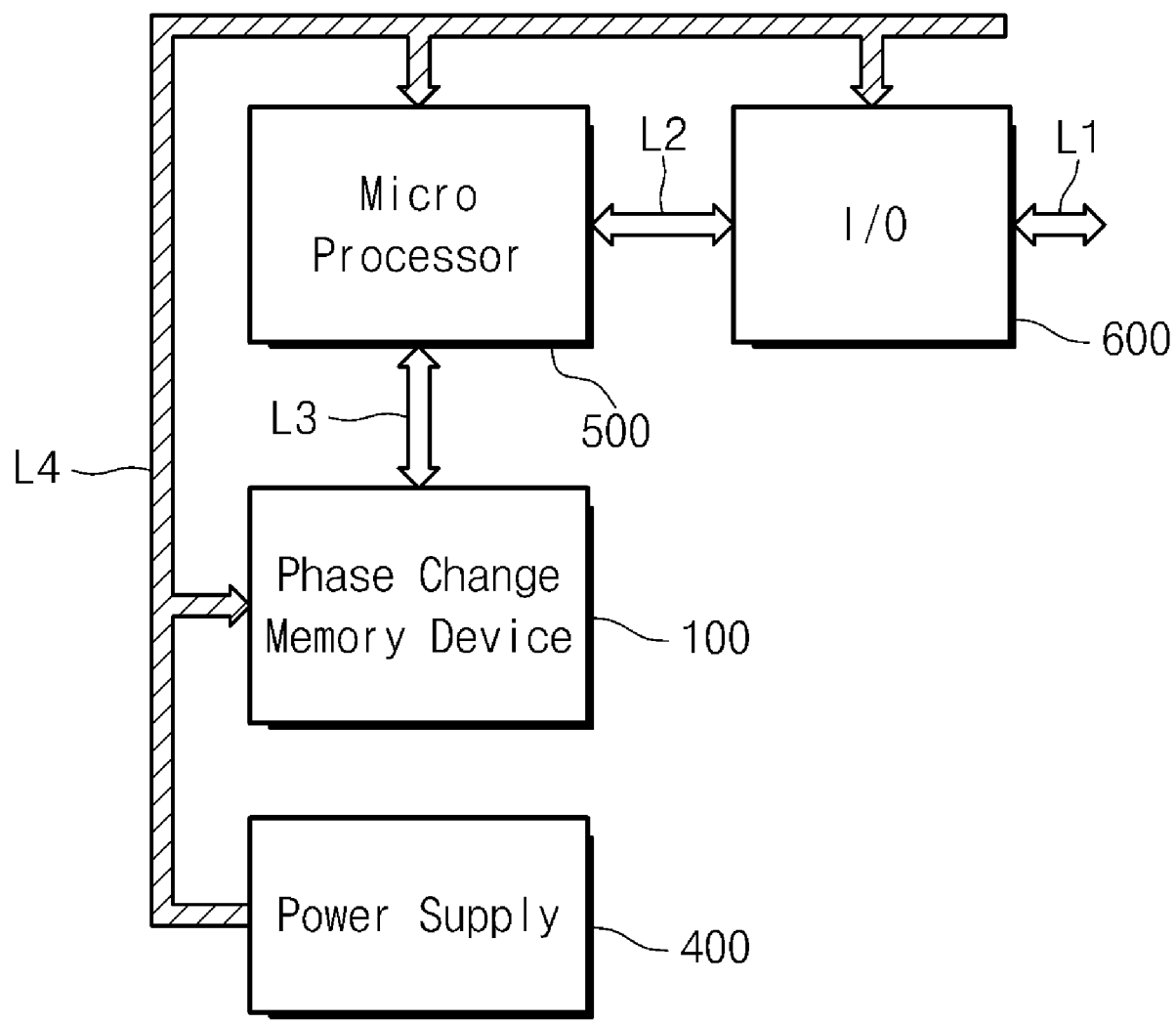
FIG. 12 is a block diagram of a portable electronic system adopting a variable resistance memory device according to an embodiment of the present invention.

FIG. 12 is a block diagram of a portable electronic system adopting a variable resistance memory device 100 according to another embodiment of the present invention. The variable resistance memory device 100 (FIG. 4) and/or 200 (FIG. 11) is connected to a microprocessor 500 through a bus line L3, serving as a main memory of the portable electronic system. A battery 400 supplies a power to the microprocessor 500, an input/output device (I/O) 600, and the variable resistance memory device 100 through a power line L4. If data is provided to the I/O 600 through a line L1, the microprocessor 500 transfers the data to the variable resistance memory device 100 through a line L3 after receiving and processing the data. The variable resistance memory device 100 stores the transferred data in a memory cell. The data stored in the memory cell is read out by the microprocessor 500 and output to the outside through the I/O 600.

Even when the power of the battery 400 is not supplied, the data stored in the memory cell of the variable resistance memory device 100 is not lost due to the characteristic of a phase change material. This is because the variable resistance memory device 100 is a non-volatile memory device, not a DRAM. Moreover, the variable resistance memory device 100 has advantageous such as higher speed and lower power consumption than other memory devices.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

For example, the embodiments described above are primarily directed to devices containing "phase-change" memory cells. However, the invention is not limited in this respect. Rather, the invention is applicable to any memory device which utilizes variable resistance memory cells which store data based on a programmed resistance thereof.

What is claimed is:

1. A variable resistance memory device comprising:
   a memory cell array having a plurality of memory cells;
   a write driver supplying a step-down set current to the memory cells, wherein the step-down set current includes a plurality of successive steps of decreasing current magnitude; and
   a set program control circuit controlling a duration of the step-down set current supplied by the write driver,
   wherein the set program control circuit controls the duration of the step-down set current in accordance with at least one of data contained in an mode register set (MRS) and a conductive state of a fuse element.

2. The variable resistance memory device as recited in claim 1, wherein the set program control circuit controls a unit step time of each step of the step-down set current.

3. The variable resistance memory device as recited in claim 2, wherein the set program control circuit controls the unit step time of each step of the step-down set current in accordance with the period of a clock signal.

4. The variable resistance memory device as recited in claim 3, wherein the set program control circuit comprises:
   an oscillator which generates the clock signal;
   a clock period controller which controls the period of the clock signal generated by the oscillator in accordance with at least one of the data contained in an mode register set (MRS) and the conductive state of the fuse element;
   a shift pulse generator which generates a plurality of shift pulses in synchronization with the clock signal; and
   a set pulse generator which receives the shift pulses and generates a set pulse,
   wherein the write driver generates the step-down set current in response to the set pulse.

5. A variable resistance memory device comprising:
   a memory cell array having a plurality of memory cells;
   a write driver which supplies a step-down set current to the memory cells, wherein the step-down set current includes a plurality of successive steps of decreasing current magnitude; and
   a set program control circuit which controls a duration of the step-down set current supplied by the write driver,
   wherein the set program control circuit controls the number of steps of the step-down set current to control the duration of the step-down set current,
   wherein the set program control circuit controls the number of steps of the step-down set current in accordance with at least one of data contained in an mode register set (MRS) and a conductive state of a fuse element.

6. The variable resistance memory device as recited in claim 5, wherein the set program control circuit eliminates one or more initial steps of the step-down set current to control the duration of the step-down set current.

7. The variable resistance memory device as recited in claim 5, wherein the set program control circuit eliminates one or more ending steps of the step-down set current to control the duration of the step-down set current.

8. The variable resistance memory device as recited in claim 5, wherein the set program control circuit eliminates one or more initial steps and one or more ending steps of the step-down set current to control the duration of the step-down set current.

9. The variable resistance memory device as recited in claim 5, wherein the set program control circuit comprises:

an oscillator which generates a clock signal;

a shift pulse generator which generates a plurality of shift pulses in synchronization with the clock signal;

a set pulse generator which receives the shift pulses to generate a set pulse; and a pulse selector which regulates a pulse width of the set pulse in accordance with at least one of the data contained in the mode register set (MRS) and the conductive state of the fuse element, wherein the write driver generates the step-down set current in response to the set pulse.

10. The variable resistance memory device as recited in claim 9, wherein the pulse selector applies a select signal for selecting among the shift pulses to the set pulse generator.

* * * * *